United States Patent
Todd et al.

(10) Patent No.: US 6,905,981 B1
(45) Date of Patent: Jun. 14, 2005

(54) LOW-K DIELECTRIC MATERIALS AND PROCESSES

(75) Inventors: Michael A. Todd, Phoenix, AZ (US); Tominori Yoshida, Phoenix, AZ (US)

(73) Assignee: ASM Japan K.K. (JP)

( * ) Notice: Subject to any disclaimer, the term of this patent is extended or adjusted under 35 U.S.C. 154(b) by 423 days.

(21) Appl. No.: 09/993,024

(22) Filed: Nov. 13, 2001

Related U.S. Application Data

(60) Provisional application No. 60/253,260, filed on Nov. 24, 2000.

(51) Int. Cl.$^7$ .............................................. H01L 21/31
(52) U.S. Cl. .................. 438/788; 438/787; 427/255.12; 427/255.39
(58) Field of Search ................................ 438/787, 788; 427/585, 255.17, 255.39

(56) References Cited

U.S. PATENT DOCUMENTS

| | | |
|---|---|---|
| 4,781,942 A | 11/1988 | Leyden et al. |
| 4,863,755 A | 9/1989 | Hess et al. |
| 4,894,352 A | 1/1990 | Lane et al. |
| 4,992,306 A | 2/1991 | Hochberg et al. |
| 5,011,706 A | 4/1991 | Tarhay et al. |
| 5,028,566 A | 7/1991 | Lagendijk |
| 5,231,058 A | 7/1993 | Maeda et al. |
| 5,240,813 A | 8/1993 | Watanabe et al. |
| 5,244,698 A | 9/1993 | Ishihara et al. |
| 5,314,724 A | 5/1994 | Tsukune et al. |
| 5,324,539 A | 6/1994 | Maeda et al. |
| 5,380,555 A | 1/1995 | Mine et al. |
| 5,433,786 A | 7/1995 | Hu et al. |
| 5,494,712 A | 2/1996 | Hu et al. |
| 5,554,570 A | 9/1996 | Maeda et al. |
| 5,563,105 A | 10/1996 | Dobuzinsky et al. |
| 5,703,404 A | 12/1997 | Matsuura |
| 5,840,821 A | 11/1998 | Nakano et al. |
| 5,876,798 A | 3/1999 | Vassiliev |
| 5,989,998 A | 11/1999 | Sugahara et al. |
| 5,998,522 A | 12/1999 | Nakano et al. |
| 6,045,877 A | 4/2000 | Gleason et al. |
| 6,051,321 A | 4/2000 | Lee et al. |
| 6,051,508 A | 4/2000 | Takase et al. |
| 6,054,379 A | 4/2000 | Yau et al. |
| 6,068,884 A | 5/2000 | Rose et al. |

FOREIGN PATENT DOCUMENTS

| | | |
|---|---|---|
| EP | 367 004 B1 | 12/1993 |
| EP | 0 436 185 B1 | 3/1996 |
| EP | 0 706 216 A2 | 4/1996 |
| EP | 0 771 886 A1 | 5/1997 |
| EP | 0 723 600 B1 | 7/1999 |
| EP | 935 283 A2 | 8/1999 |
| EP | 0 960 958 A2 | 12/1999 |
| JP | 09293716 | 11/1997 |
| JP | 11176829 | 7/1999 |
| WO | WO 97/40207 | 10/1997 |
| WO | WO 97/41592 | 11/1997 |
| WO | WO 99/21706 | 5/1999 |
| WO | WO 99/41423 | 8/1999 |
| WO | WO 99/55526 | 11/1999 |
| WO | WO 99/60621 | 11/1999 |

OTHER PUBLICATIONS

Shirafuji, PECVD of Fluorocarbons/SiO Composite Thin Films using C4F8 and HMDSO, pp. 57–75.*

Bayer et al., *Overall kinetics of SIOx remote—PECVD using different organosilicon monomers*, Surface and Coatings Technology, 116–119 (1999) 874–878.

(Continued)

Primary Examiner—Alexander Ghyka
(74) Attorney, Agent, or Firm—Knobbe Martens Olson & Bear LLP

(57) ABSTRACT

Improved dielectric materials suitable for use in integrated circuits and computer systems are provided by a chemical vapor deposition process employing fluoroalkane precursors.

12 Claims, 2 Drawing Sheets

GAS FLOW DIAGRAM

OTHER PUBLICATIONS

Berjoan et al., *XPS and XPS valence band characterizations of amorphous or polymeric silicon based thin films prepared by PACVD from organosilicon monomers*, J. Phys. IV France 9(1999) pp. 1059–1068.

Constant et al., *Some Properties of amorphous SIXCI–x (H) alloys prepared by CVD from various organosilicon compounds*, Solid State Chemistry, 1982, pp. 267–270.

Deville et al., *An AES study of the influence of carbon on the chemical structure of some oxide films deposited by PEVCD of organosilicon precursors*, Applied Surface Science 137 (1999) 136–141.

Fonseca et al., *Plasma Polymerization of Tetramethylsilane*, Am. Chemical Society, 1993, 5, 1676–1682.

Inoue et al., *Mass spectroscopy in plasma–enhaced chemical vapor deposition of silicon–oxide films using tetramethoxylsilane*, Thin Solid Films 316(1998) 79–84.

Inoue et al., *Spectroscopic studies on preparation of silicon oxide films by PECVD using organosilicon compounds*, Plasma Sources Sci. Technol. 5 (1996) 339–343.

Loboda, M.J., *New solutions for intermetal dielectrics using trimethylsilane–based PECVD processes*, Microelectronic Enginering 50 (2000) 15–23.

Nguyen et al., *Plasma organosilicon polymers*, J. Electrochem. Soc., Aug. 1985, pp. 1925–1932.

Shirafuji et al., *PE–CVD of Fluorocarbon/SiO composite thin films using C4F8 and HMDSO1*, Plasmas and Polymers, Vo. 4, No. 1, 1999, pp. 57–75.

Shirafuji et al., *PE–CVD of fluorocarbon/silicon oxide composite thin films from TFE and HMDSO*, Mat. Res. Soc. Symp. Proc. vol. 544, pp. 173–178.

Shirafuji et al., *Plasma copolymerization of tetrafluoroethylene/hexamethyldisiloxane and in Situ Fourier Transform Infrared spectroscopy of its gas phase*, Jpn. J. Appl. Phys-.vol. 38 (1999) pp. 4520–4526.

Sugahara et al., *Low Dielectric constant carbon containing SiO2 films deposited by PECVD technique using a novel CVD precursor*, DUMIC Conference, Feb. 10–11, 1997, pp. 19–25.

Thomas et al., *Plasma etching and surface analysis of a SIC:H films deposited by low temperature plasma enhanced chemical vapor deposition*, Mat. Res. Soc. Symp. Proc. Vo. 334, 1994, pp. 445–450.

Matsuki, N., U.S. Appl. No. 09/243,156 *Silicone Polymer insulation film on semiconductor substrate and method for forming the film*, filed Feb. 2, 1999.

Indrajit Banerjee, et al., "Characterization of Chemical Vapor Deposited Amorphous Flourocarbons for Low Dielectric Constant Interlayer Dielectrics," J. Electrochem. Soc. vol. 146(6), p. 2219(1999).

Sang–Soo Han, et al., "Deposition of Fluorinated Amorphous Carbon Thin Films as a Low–Dielectric Constant Material," J. Electrochem. Soc., vol. 148(9), p. 3383 (1999).

H. Beckers, et al., "Synthesis and Properties of (Triflouromethyl) trichlorosilane, a Versatile Precursor for CF3SI Compounds, " J. Organometal, Chem. vol. 316, pp. 41–50, (1986).

C.A. Costello and J.J. McCarthy, "Introduction of Organic Functional Groups onto the Surface of Poly(tetrafluoreothylene)," Proceedings of the ACS Divison of Polymeric Materials Science and Engineering, vol. 55 p. 893 (1986).

K.G. Sharp and T.D. Coyle. "Synthesis and Some Properties of Trifluoro(trifluoromethyl) silane," J. Fluorine Chem., vol. Q, pp. 249–251 (1971/72).

Limb, Scott J., et al., "Growth of fluorcarbon polymer thin films with high CF2 fractions and low dangling bond concentrations by thermal chemical vapor deposition," App. Phys. Lett, vol. 68(20), p. 2810 (1996).

Washburne, Stephen S., et al., "Chioraminosilanes I: The Preparation of Chioro(Dimethylamino Hydrogen Silanes," Inorg. Nucl. Chem. Letters vol. 5, pp. 17–19, Pergaomon Press.

Savage, Charles R., et al., "Spectroscopic Characterization of Films Obtained in Pulsed Radio–Frequency Plasma Discharges of Fluorocarbon Monomers," Structure–Property Relations in Polymers, pp. 745–768, America Chemical Society, (1993).

Sharp, K.G., et al., "Perflouro(alkylsilanes). II: Trifluoro(t-rifluoromethyl) silane and Trifluoro(pentafluoroethyl) silane," Inorg. Chem., vol. 11, No. 6, pp. 1259–1264, (1792).

Pam Frost Gorder, "Researchers Pioneer Rechniques to Lubicate Microdevices," Research News, Ohio State University, http://www.acs.ohio–state.edu/units/research, (Mar. 23, 2001).

Chandrasekhar et al., "New Silicon–Carbon Materials Incorporating $Si_4C$ Building Blocks" Mat. Res. Soc. Symp. Proc. vol. 441, Materials Research Society (1997).

* cited by examiner

Top of film stack

Bottom of film stack

GAS FLOW DIAGRAM

LOW-K DIELECTRIC MATERIALS AND PROCESSES

RELATED APPLICATION INFORMATION

This application claims priority to U.S. Provisional Application No. 60/253,260, filed Nov. 24, 2000, which is hereby incorporated by reference in its entirety.

BACKGROUND OF THE INVENTION

1. Field of the Invention

This invention relates generally to low dielectric constant materials, and more particularly to chemical vapor deposition (CVD) processes for making these materials, and the use of these materials as dielectric layers in microelectronic devices.

2. Description of the Related Art

As the dimensions of microelectronic devices become smaller, the importance of the physical properties of the materials used in their manufacture becomes more important. This is particularly true of the dielectric materials that are used to insulate metal lines and vias from one another because of the contributions to capacitance that these materials make. Silicon dioxide has been employed within the industry as a dielectric material for the manufacture of devices for nearly three decades, but may become less suitable in the future because of its relatively high dielectric constant (k~4.1).

A number of fluorinated materials have been studied as possible replacements for silicon dioxide. U.S. Pat. No. 5,563,105 discloses a chemical vapor deposition (CVD) process employing $SiF_4$ and tetraethoxysilane (TEOS) to form a fluorosilicate glass, which is stated to have lower water absorption than a sample formed from $C_2F_6$. U.S. Pat. No. 5,703,404 discloses silicon oxide films containing Si-F bonds through the use of fluorosilanes. U.S. Pat. No. 5,876,798 discloses the use of fluorotriethoxysilane (FTES). The use of fluorinated compounds containing carbon-carbon double bonds is disclosed in U.S. Pat. Nos. 5,989,998. 6,051,321 discloses the use of fluorinated aromatic compounds. U.S. Pat. No. 5,900,290 discloses the use of octafluorocyclobutane, as does T. Shirafuji et al., "PE-CVD of Fluorocarbon/SiO Composite Thin Films Using $C_4F_8$ and HMDSO," Plasmas and Polymers, Vol. 4, No. 1, p. 57, 1999. Other references in this regard are Indrajit Baneree, et al., "Characterization of Chemical Vapor Deposited Amorphous Fluorocarbons for Low Dielectric Constant Interlayer Dielectrics." J. Electrochem. Soc., Vol. 146(6), p. 2219, 1999; C. B. Labelle, et al., DUMIC, pg. 1998, 1997; and Sang-Soo Han, et. al., "Deposition of Fluorinated Amorphous Carbon Thin Films as a Low-Dielectric Constant Material." J. Electrochem. Soc., Vol. 146(9), p. 3383, 1999.

Amorphous fluorinated carbon (a-C:F) materials are a promising class of fluorinated materials. However, the known materials have been shown to be severely lacking in one or more aspects for use in microelectronics manufacturing. Some of the known issues with currently known a-C:F materials include: low thermal stability (e.g., less than 300° C. at k~2.2 or below), anisotropic dielectric constant (in-plane vs. out-of-plane), low mechanical stability, low modulus and glass transition temperature, low adhesion strength, particularly at elevated processing temperatures, fluorine out-diffusion during subsequent thermal treatments, and fluorine etching of existing structures during processing.

Therefore, there remains a need for fluorinated carbon films having better properties more suitable for use in microelectronics manufacturing, and for processes for producing such films that can be readily integrated into fabrication process flows.

SUMMARY OF THE INVENTION

In accordance with one aspect of this invention, a process is provided for depositing a dielectric material on a surface. The process includes providing a chemical vapor deposition chamber having disposed therein a substrate; introducing a gas comprised of a fluoroalkane to the chamber; and depositing a doped fluorinated carbon film onto the substrate. Desirably, the doped fluorinated carbon film has a dielectric constant of about 2.5 or less. In accordance with another aspect of this invention, an integrated circuit is provided. The integrated circuit includes a low dielectric constant doped fluorinated carbon film.

DETAILED DESCRIPTION OF THE PREFERRED EMBODIMENTS

Figure 1:
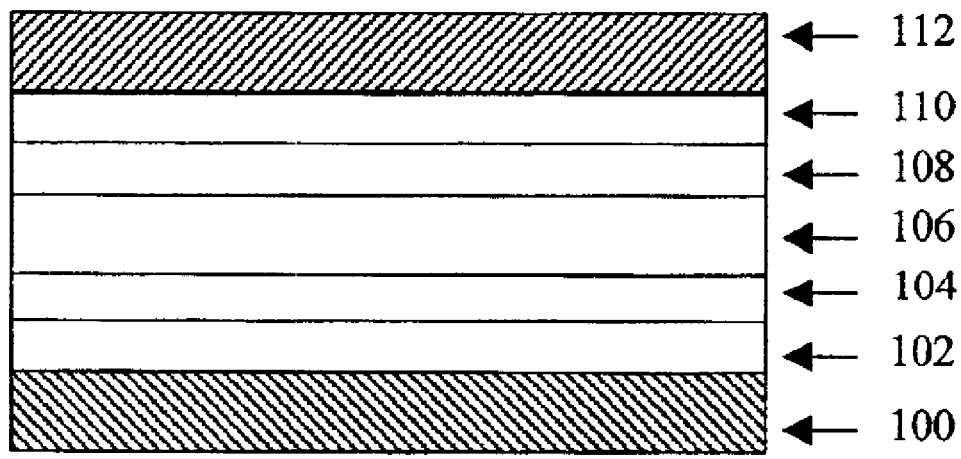
FIG. 1 is a schematic cross section of a film stack having seven layers, 100, 102, 104, 106, 108, 110 and 112.

The preferred embodiments involve processes for depositing a dielectric material on the surface of a substrate, integrated circuits comprised of such substrates having a doped fluorinated carbon film deposited thereon, and computer systems comprised of such an integrated circuit.

The disclosed processes may be suitably practiced by employing chemical vapor deposition (CVD), preferably plasma-enhanced chemical vapor deposition (PECVD) or thermal CVD, utilizing a feed gas comprised of a fluoroalkane to deposit a fluorinated carbon film onto a substrate contained within a chemical vapor deposition chamber. Suitable CVD chambers are generally well-known to those skilled in the art, see e.g. U.S. Pat. No. 5,900,290, which is hereby incorporated herein by reference. A suitable manifold may be used to supply feed gas(es) to the CVD chamber. As used herein, a "fluorinated carbon film" contains carbon, fluorine, and optionally other elements, preferably suitable dopants as disclosed herein.

In a preferred embodiment, the processes involve the use of relatively long-chain length fluoroalkane precursors that are rich in —$CF_2$— groups. This tends to maximize the —$CF_2$— content of the deposited doped fluorinated carbon film, while also allowing the use of lower energies to "crack" the precursors. This represents a great advantage over known PE-CVD processes that rely on the use of $CF_4/CH_4$ mixtures or other, short-chain length fluoroalkanes. Thus, the feed gas to the chemical vapor deposition chamber is preferably comprised of a linear fluoroalkane having 4 or more carbon atoms, more preferably about 5 to about 9 carbon atoms. The fluoroalkanes may contain some CHF groups, but preferably more than half, and more preferably more than 75%, of the carbon atoms are $CF_2$ groups. Especially preferred fluoroalkanes include $C_5F_{12}$; $C_6F_{14}$; $C_7F_{16}$; $C_8F_{18}$ and $C_9F_{20}$.

By creating suitable conditions in the CVD chamber, the feed gas comprised of the fluoroalkane becomes chemically active and forms a deposit of doped fluorinated carbon film on a substrate contained within the CVD chamber. The feed gas and/or substrate may be suitably heated to a temperature in the range of about 150° C. to about 600° C. Preferably, the feed gas is ionized using plasma energy to create fluoroalkane radicals by applying high- or low-radio frequency power. In a preferred embodiment, an in situ plasma is created within the CVD chamber by methods well known to those skilled in the art. An exemplary CVD chamber for this process is an Eagle-10™ reactor, commercially available from ASM Japan K.K., of Tokyo, Japan. Preferred power levels may range up to about 5 kW. For plasma-enhanced CVD (PECVD), the substrate is preferably heated to a temperature in the range of about 200° C. to about 400° C.

Thermal CVD may be practiced by heating the gas or substrate to an extent that is effective to render the fluoroalkane chemically active. For thermal CVD, the substrate is preferably heated to a temperature in the range of about 300° C. to about 500° C. Preferably, both heat and plasma energy are employed in depositing the doped fluorinated carbon film. The deposition of the doped fluorinated carbon film is preferably carried out using relatively low energies so as not to overly fragment the fluoroalkane, thus incorporating relatively long sequences of —$CF_2$— groups into the film. Preferably, the film is comprised of —$CF_2CF_2$— groups, more preferably —$CF_2CF_2CF_2$— groups. Preferably, more than about 25%, more preferably more than about 50%, of the weight of fluorine in the film is in the form of —$CF_2$—.

The dielectric constant of the doped fluorinated carbon film is related to the content of —$CF_2$— groups, so that a film having a greater content of —$CF_2$— groups generally has a lower dielectric constant. The dielectric constants for the films of this invention are preferably about 3.0 or less, more preferably about 2.4 or less, and most preferably about 2.2 or less. The doped fluorinated carbon film is preferably thermally stable up to about 400° C. when doped in situ. "Thermally stable" signifies that the film experiences no significant outgassing or attendant changes in physical properties when heated.

The fluorinated carbon films of the preferred embodiments can be suitably doped with further elements in order to alleviate the known shortcomings of fluorinated carbon films. The controlled addition of suitable dopants may provide improved film adhesion, improved thermomechanical stability relative to undoped or uncrosslinked polymers, improved plasma characteristics, and/or further reduction of the dielectric constant relative to undoped fluorinated carbon films. Suitable dopants include alkanes having from 1 to 9 carbons, methyl silane, ethyl silane, dimethyl silane, diethylsilane, methyl germane, ethyl germane, dimethylgermane, diethylgermane, disilylmethane, silanes of the form $Si_nH_{2n+2}$ (e.g., silane, disilane, trisilane), germane, digermane and mixtures thereof. Preferred dopants are methylsilane and methylgermane. These dopants may be supplied to the CVD chamber in the feed gas, preferably in admixture with the fluoroalkane gas.

For PECVD, the total pressure in the CVD chamber is preferably in the range of about 0.001 torr to about 5 torr, most preferably in the range of about 0.1 torr to about 2 torr. For thermal CVD, the total pressure in the CVD chamber is preferably in the range of about 0.001 torr to about 50 torr, most preferably in the range of about 0.1 torr to about 5 torr. The partial pressure of fluoroalkane is preferably in the range of about 5% to about 100% of the total pressure, more preferably about 25% to about 100%, same basis. In some cases (e.g., the graded layers, as discussed below), the fluoroalkane flow can be zero at some point in the deposition process. The partial pressure of each dopant is preferably in the range from 50% to about 0% of the total pressure, more preferably about 20% to about 5%, same basis. The feed gas can also include gases other than fluoroalkane and dopant sources, preferably inert gases such as helium, although other reactant gases may also be used. More preferably, the partial pressure of the dopant gas is effective to provide the doped fluorinated carbon film with a Si or Ge content of about 20% or less, even more preferably about 10% or less, by atomic percentage.

The relative partial pressures of the fluoroalkane and dopant can be held relatively constant over the course of depositing the fluorinated carbon film, or preferably varied to produce a graded film which has differing amounts of dopant and —$CF_2$— groups as a function of depth within the thickness of the film. Preferably, the graded portion of the film has a thickness in the range of about 5 Å to about 500 Å, more preferably between about 10 Å and 50 Å. Ungraded or bulk films will typically be thicker, such as up to about 1 micron for the bulk portion of an interlevel dielectric in an integrated circuit. Thus, the elemental composition of the film may vary in a stepwise and/or continuous fashion. Film thickness may be varied according to the intended application as known in the art, by varying the deposition variables.

FIG. 1 is a cross-sectional diagram of a film stack (not to scale) illustrating an interlevel dielectric in an integrated circuit, with the dielectric having stepwise gradation. In this embodiment, a metal conductor 100 serves as a substrate and a first doped fluorinated carbon film 102 overlies metal conductor 100. Film 102 has a relatively high dopant level such that adhesion to layer 100 is maximized. A second doped fluorinated carbon film 104 overlies film 102. Layer 106 comprises a low-k dielectric fluorinated carbon film and has a relatively low level of dopant. Second doped fluorinated carbon film 104 has an intermediate dopant level such that adhesion to both films 102 and 106 is maximized. Third doped fluorinated carbon film 108 overlies low-k dielectric 106 and has an intermediate dopant level, similar to film 104. Likewise, fourth doped fluorinated carbon film 110 overlies film 108 and has a relatively high dopant level, similar to film 102. The interlevel dielectric also comprises metal conductor 112, which overlies film 110.

Figure 2:
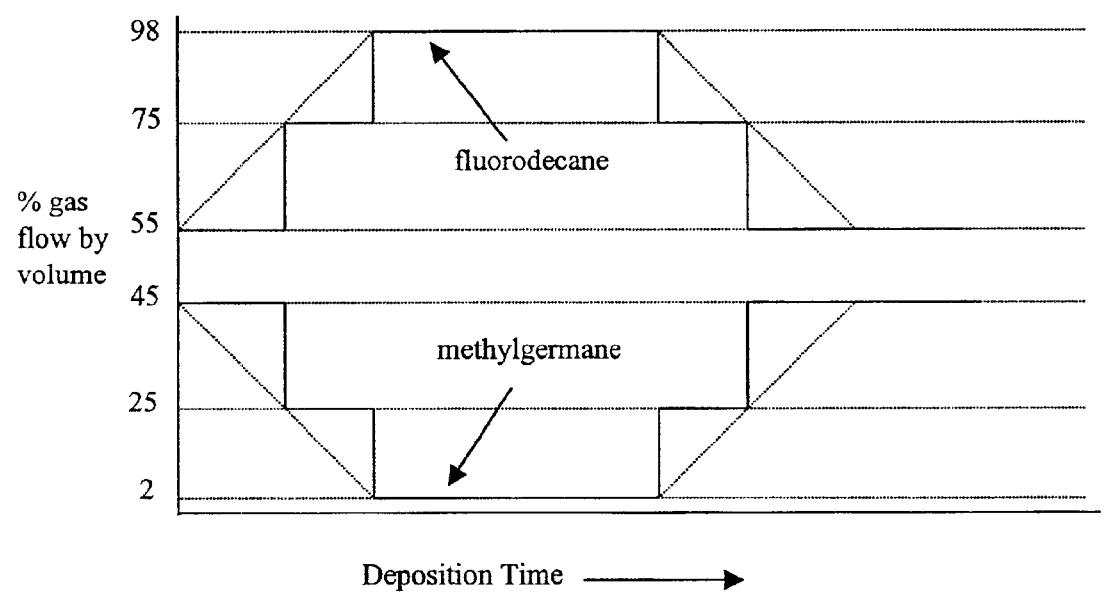
FIG. 2 is a plot of gas flow vs. time for CVD using a fluorodecane precursor and methylgermane dopant. The solid lines illustrate stepwise deposition and the dotted lines illustrate graded deposition.

The method for forming layers 102–110 may be stepwise to produce a layered structure as shown in FIG. 1 or, preferably, one or more layers may be graded so that the elemental composition of one or more layers changes in a continuous fashion instead of stepwise. Stepwise and graded deposition may be accomplished by controlling the gas flow as illustrated in FIG. 2. As the deposition proceeds, the relative amount of dopant decreases and the relative amount of fluoroalkane increases, then the process is reversed. The embodiment in FIG. 2 shows a plateau region for the deposition of a middle "bulk" dielectric layer, but this layer may also be graded as desired.

FIGS. 1 and 2 shows only a marginally longer plateau time for deposition of the bulk layer of constant, low-doped constitution; however, the skilled artisan will understand in view of the present disclosure that the bulk, very low k layer will preferably be much thicker than the graded super- and sub-layers. The graded portions of the sandwich structure are preferably only thick enough to provide adhesion between the bulk intermediate layer and the adjacent materials.

Graded deposition may proceed by a continuous, dynamically changing process. For example, deposition of layer 100 can be followed immediately by graded layers 102 and 104, followed immediately by dielectric layer 106, etc., with continuous deposition for the entire stack. This type of processing represents a tremendous advantage over other processing techniques, e.g., spin-n processes that cannot easily deliver the reagents in the fashion required to deposit a graded elemental concentration.

The use of these dopants as described herein tends to increase the thermomechanical stability of the doped fluorinated carbon film while minimizing anisotropic dielectric constant properties. The use of dopants in a graded concentration fashion also aids in film nucleation and adhesion. Dopants that contain hydrogen that is easily liberated from the molecules help to reduce free fluorine etching issues. As such, they represent a decrease in the total number of reagents required to synthesize the desired materials and a resulting process simplification, as well as a route into novel copolymer materials that can exhibit greatly improved physical properties as a result of increased three-dimensional crosslinking.

Depending on the processing conditions, the physical properties of the deposited doped fluorinated carbon films can be tailored by varying the reactants and CVD conditions as taught herein. Superior thermal stability (preferably to at least 400° C.), high glass transition and softening temperatures, high bulk modulus, reduced coefficient of thermal expansion, improved resistance to fluorine diffusion, improved adhesion, and decrease or elimination of anisotropic dielectric constant can be attained from a higher degree of three-dimensional crosslinking, crosslinking through non-carbon atoms such as Si and Ge, and presence of dopant elements (e.g. Si and/or Ge). Ultra-low dielectric constants of about 2.2 or less can be attained from a high $-CF_2-$ content and reduction in density arising from addition of $-CH_3$ moieties. Materials integration advantages may also be realized because of these improvements in the physical properties.

The substrates having a doped fluorinated carbon film deposited thereon can be incorporated into integrated circuits in the usual manner, particularly as interlevel dielectric layers between conductive levels (e.g., metal layers) within the circuit. The doped fluorinated carbon films enable lower dielectric constants and other advantages as described herein, thus translating into reduced parasitic capacitance and thus improved performance for the integrated circuits into which they are incorporated. Likewise, computer systems having improved performance may be obtained by incorporating the improved integrated circuits into the systems in the usual manner.

In another preferred embodiment, a CVD apparatus configured to carry out the methods described herein is provided. A preferred CVD apparatus includes a chemical vapor deposition chamber, more preferably an Eagle-10™ reactor (available commercially from ASM Japan K.K., of Tokyo, Japan), having a substrate disposed therein. Preferably, the chamber contains a support for the substrate that is capable of supplying heat to the substrate, e.g., resistively heated. A preferred CVD apparatus also contains a vessel containing a linear fluoroalkane, preferably containing from about 5 to about 9 carbon atoms, one or more feed lines connecting the vessel to the CVD chamber, and a manifold operatively connected to the feed line to control the passage of the linear fluoroalkane to the CVD chamber. Preferably, the apparatus includes a plasma source for creating a remote plasma or, even more preferably, an in situ plasma Most preferably, the manifold is a showerhead that also serves as an electrode, with the substrate grounded to the support to serve as a second electrode.

Although the foregoing invention has been described in terms of certain preferred embodiments, other embodiments will become apparent to those of ordinary skill in the art in view of the disclosure herein Accordingly, the present invention is not intended to be limited by the recitation of preferred embodiments, but is intended to be defined solely by reference to the appended claims.

EXAMPLES

Example 1

A gas comprised of perfluorononane ($F_3C(CF_2)_7CF_3$) having a partial pressure equal to 95% of the total pressure, and methylsilane ($H_3CSiH_3$) having a partial pressure equal to 5% of the total pressure, is introduced into a PE-CVD reactor chamber maintained at a pressure of 2 Torr that contains a silicon substrate maintained at 350° C. A plasma is then initiated in this gas mixture using 13.56 MHz radiation at a power level of 2.0 Watts per square centimeter of substrate surface area to deposit a film containing C, F, H and Si on the substrate. This example illustrates the use of plasma enhanced CVD reaction to deposit a doped a-C:F material.

Example 2

A gas comprised of perfluorooctane ($F_3C(CF_2)_6CF_3$) having a partial pressure equal to 75% of the total pressure, and methylgermane ($H_3CGeH_3$) having a partial pressure equal to 25% of the total pressure, is introduced into a PE-CVD reactor chamber maintained at a pressure of 2 Torr that contains a silicon substrate maintained at 350° C. A plasma is then initiated in this gas mixture using 13.56 MHz radiation at a power level of 2.0 Watts per square centimeter of substrate surface area to deposit a film containing C, F, H and Ge on the substrate.

Example 3

A gas comprised of perfluoroheptane ($F_3C(CF_2)_5CF_3$) having a partial pressure equal to 85% of the total pressure, and methylgermane ($H_3CGeH_3$) having a partial pressure equal to 15% of the total pressure, is introduced into a PE-CVD reactor chamber maintained at a pressure of 2 Torr that contains a silicon substrate maintained at 350° C. A plasma is then initiated in this gas mixture using 13.56 MHz radiation at a power level of 2.0 Watts per square centimeter of substrate surface area to deposit a film containing C, F, H and Ge on the substrate. This film contains more $-CF_2-$ groups and less Ge, C and H than the film produced in Example 2.

Example 4

A gas comprised of perfluorononane ($F_3C(CF_2)_7CF_3$) having a partial pressure equal to 98% of the total pressure, and methylgermane ($H_3CGeH_3$) having a partial pressure equal to 2% of the total pressure, is introduced into a PE-CVD reactor chamber maintained at a pressure of 2 Torr that contains a silicon substrate maintained at 350° C. A plasma is then initiated in this gas mixture using 13.56 MHz radiation at a power level of 2.0 Watts per square centimeter of substrate surface area to deposit a film containing C, F, H and Ge on the substrate. More than 50% of the fluorine in this film is in the form of $-CF_2-$ groups and this film contains much less Ge, C and H than the films produced in Examples 2 or 3. This film has a dielectric constant of less than 2.2.

Example 5

The processes described in Examples 1–4 above are carried out sequentially in a stepwise fashion to produce a film stack, except that the same chemical precursors are preferably used throughout the graded sub-layers to avoid complicated gas switching mid-process. The first three sub-layers are each about 20 Å thick and the fourth low-k "bulk" layer is about 0.5 micron thick. These layers are preferably conducted in situ without substrate removal or pause between steps, apart from the time required to switch gas flow concentration.

Additionally, as shown in the gas-flow diagram of FIG. 2, another graded layer or set of sub-layers is deposited over the bulk layer, in reverse sequence of Examples 1–4. The grading above and below the bulk dielectric facilitate good adhesion to adjacent materials in the semiconductor structure, as compared to Teflon™-like materials having low to no doping (e.g., the bulk layer in the present example).

Example 6

The processes described in Examples 1–4 above are carried out sequentially as in Example 5 above, except that the relative partial pressures of perfluoroalkanes, methylgermane, and methylsilane are changed gradually, instead of stepwise, to produce a film stack having a graded concentration profile of F, Si, and Ge as a function of depth.

Example 7 the process of Example 6 is carried out in the general manner illustrated in FIGS. 1 and 2 by depositing a film onto a conductor such that the film is initially enriched in silicon, then steadily more enriched in F to produce a low-k dielectric layer, then once again steadily enriched in silicon to produce a surface that readily adheres to a conductor deposited onto the polymer.

We claim:

1. A process for depositing a dielectric material on a surface, comprising providing a chemical vapor deposition chamber having disposed therein a substrate;

introducing a gas comprised of a linear fluoroalkane having four or more carbon atoms to said chamber introducing a suitable dopant source gas for providing the dielectric material with thermomechanical stability; and depositing a doped fluorinated carbon film onto said substrate.

2. A process as claimed in claim 1, wherein said doped fluorinated carbon film has a dielectric constant of about 2.5 or less.

3. A process as claimed in claim 1, wherein said doped fluorinated carbon film has a dielectric constant of about 2.2 or less.

4. A process as claimed in claim 1, wherein said linear fluoroalkane contains about 5 to about 9 carbon atoms.

5. A process as claimed in claim 1, wherein said depositing is performed under plasma-enhanced chemical vapor deposition conditions.

6. A process as claimed in claim 1, wherein said depositing is performed at a temperature of about 400° C. or less in the presence of an in-situ plasma.

7. A process as claimed in claim 1, wherein said depositing is performed under thermal chemical vapor deposition conditions by heating said substrate to a temperature in the range of about 300° C. to about 500° C.

8. A process as claimed in claim 1, wherein said dopant source gas further comprises a dopant selected from the group consisting of methyl silane, ethyl silane, dimethyl silane, diethylsilane, methyl germane, ethyl germane, dimethyl germane, diethylgermane, disilylmethane, silane, disilane, trisilane, germane, digermane, and mixtures thereof.

9. A process as claimed in claim 1, wherein said gas further comprises an alkane having from 1 to 9 carbons.

10. A process as claimed in claim 1, wherein said dopant source gas comprises methyl silane or methyl germane.

11. A process as claimed in claim 1, wherein sad doped fluorinated carbon film comprises —$(CF_2)_n$— units linked to dopant molecules.

12. A process for depositing a dielectric material on a surface, comprising providing a chemical vapor deposition chamber having disposed therein a substrate;

introducing a gas comprises of a linear fluoroalkane having four or more carbon atoms and a dopant source to said chamber;

creating a plasma within said chamber; and depositing a doped fluorinated carbon film onto said substrate, wherein said doped fluorinated carbon film has a dielectric constant of about 2.5 or less.

* * * * *

UNITED STATES PATENT AND TRADEMARK OFFICE
CERTIFICATE OF CORRECTION

PATENT NO. : 6,905,981 B1
DATED : June 14, 2005
INVENTOR(S) : Michael A. Todd and Tominori Yoshida It is certified that error appears in the above-identified patent and that said Letters Patent is hereby corrected as shown below:

Column 8,
Line 30, delete "sad" and insert therefor, -- said --.
Line 37, delete "comprises" and insert therefor, -- comprised --.

Signed and Sealed this

Eighth Day of November, 2005

JON W. DUDAS
*Director of the United States Patent and Trademark Office*